(12) United States Patent
Stanley

(10) Patent No.: US 6,909,321 B2
(45) Date of Patent: Jun. 21, 2005

(54) ACTIVE ISOLATED-INTEGRATOR LOW-PASS FILTER WITH ATTENUATION POLES

(75) Inventor: Gerald R. Stanley, Osceola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 0 days.

(21) Appl. No.: 09/748,609

(22) Filed: Dec. 26, 2000

(65) Prior Publication Data

US 2001/0048345 A1 Dec. 6, 2001

Related U.S. Application Data

(60) Provisional application No. 60/174,201, filed on Jan. 3, 2000.

(51) Int. Cl.[7] .................................................. H03K 5/00
(52) U.S. Cl. ........................ 327/558; 327/552; 327/556; 330/107; 330/109
(58) Field of Search ................................ 327/552, 556, 327/557, 558, 559, 561; 330/107, 109, 110

(56) References Cited

U.S. PATENT DOCUMENTS

| | | | | |
|---|---|---|---|---|
| 3,679,987 A | * | 7/1972 | Moschytz | 330/107 |
| 5,107,491 A | * | 4/1992 | Chew | 370/445 |
| 5,179,302 A | * | 1/1993 | Wagner | 327/553 |
| 5,345,407 A | * | 9/1994 | Hostetler | 364/724.01 |
| 5,635,871 A | * | 6/1997 | Cavigelli | 330/107 |
| 5,963,112 A | * | 10/1999 | Moschytz | 327/552 |
| 6,271,719 B1 | * | 8/2001 | Sevastopoulos | 357/552 |
| 6,344,773 B1 | * | 2/2002 | Sevastopoulos et al. | 327/552 |

OTHER PUBLICATIONS

"Tunable RC Null Networks", by Ralph Glasgel, Oct. 1969 issue of EEE, pp. 70–74.

"A Practical Method of Designing RC Active Filters", by R.P. Sallen and E.L. Key, Reprinted from IRE Trans. Circuit Theory, vol. CT–2, pp. 74–85, Mar. 1955, pp. 51, 53, 55, 57, 59 and 61.

Olsson: "New Null Filter Replaces Twin–T", Electronics World and Wireless World, vol. 101, No. 1707, Feb. 1995 pp. 119–120, Reed Publishing, Sutton, Surrey, GB.

Serge Ramef: "A Low Distortion Anti–Aliasing Smoothing Filter for Sampled Data Integrated Circuits", IEEE Journal of Solid–State Circuits, vol. 23, No. 5, Oct. 1988, pp. 1267–1270, Ieee Inc., New York, US.

* cited by examiner

*Primary Examiner*—Terry D. Cunningham
(74) *Attorney, Agent, or Firm*—Brinks Hofer Gilson & Lione

(57) ABSTRACT

The present invention provides an active low-pass filter system including a low-pass filter circuit and at least one frequency-rejecting network coupled to the low-pass filter circuit. The frequency-rejecting network is included in a resistive forward signal flow branch of the low-pass filter. The present invention also provides a power amplifier system for driving a load. The power amplifier system includes a pulse width modulation circuit which creates ripple spectra, an error amplifier and modulator circuit, and a demodulation filter connected in series, and a feedback control loop coupled to the pulse modulation circuit and including an active low-pass filter having a feedback demodulation filter and an isolated-integrator frequency-rejecting network.

12 Claims, 6 Drawing Sheets

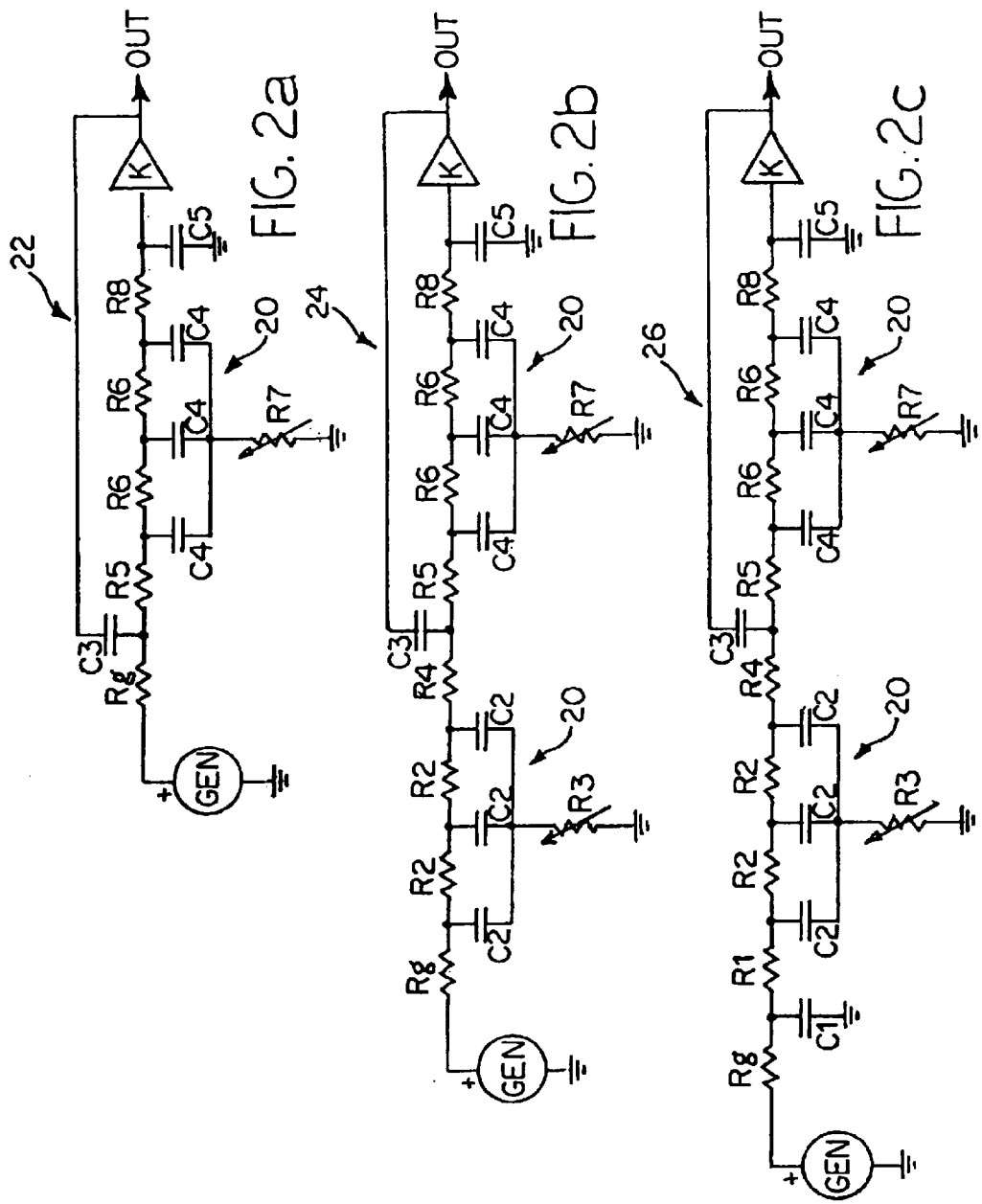

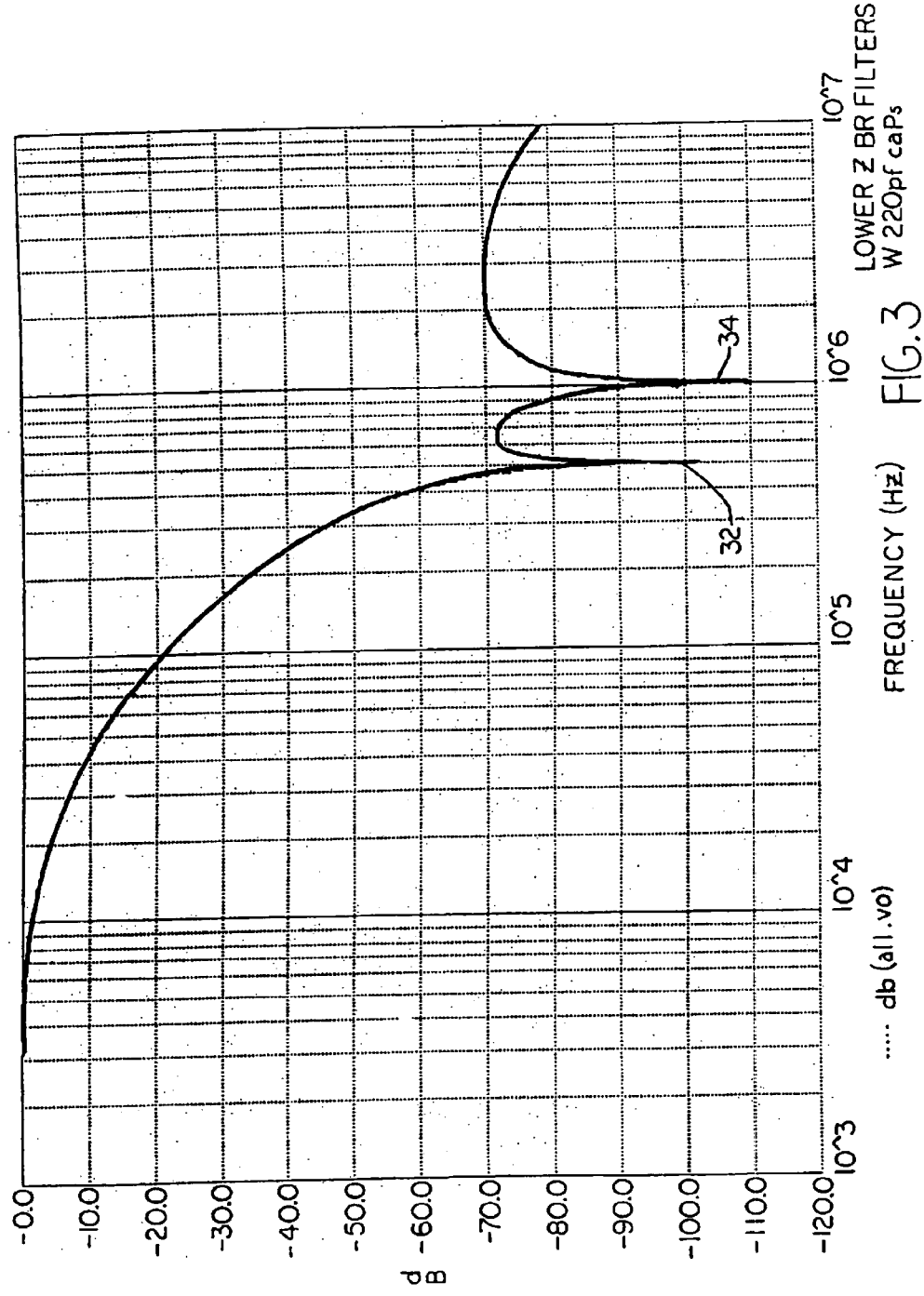

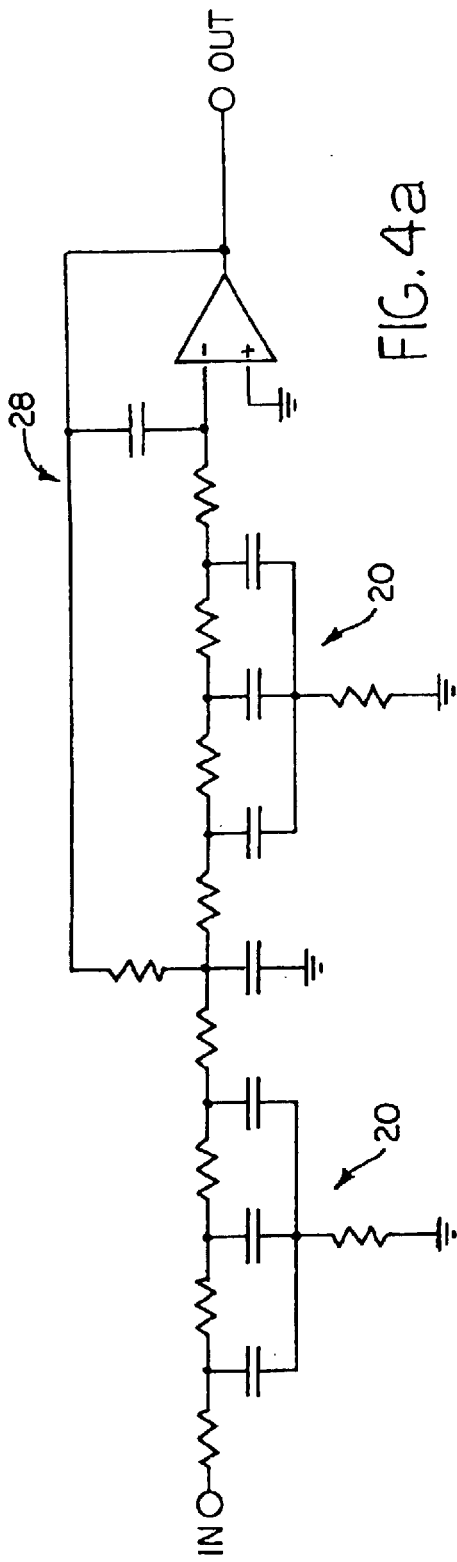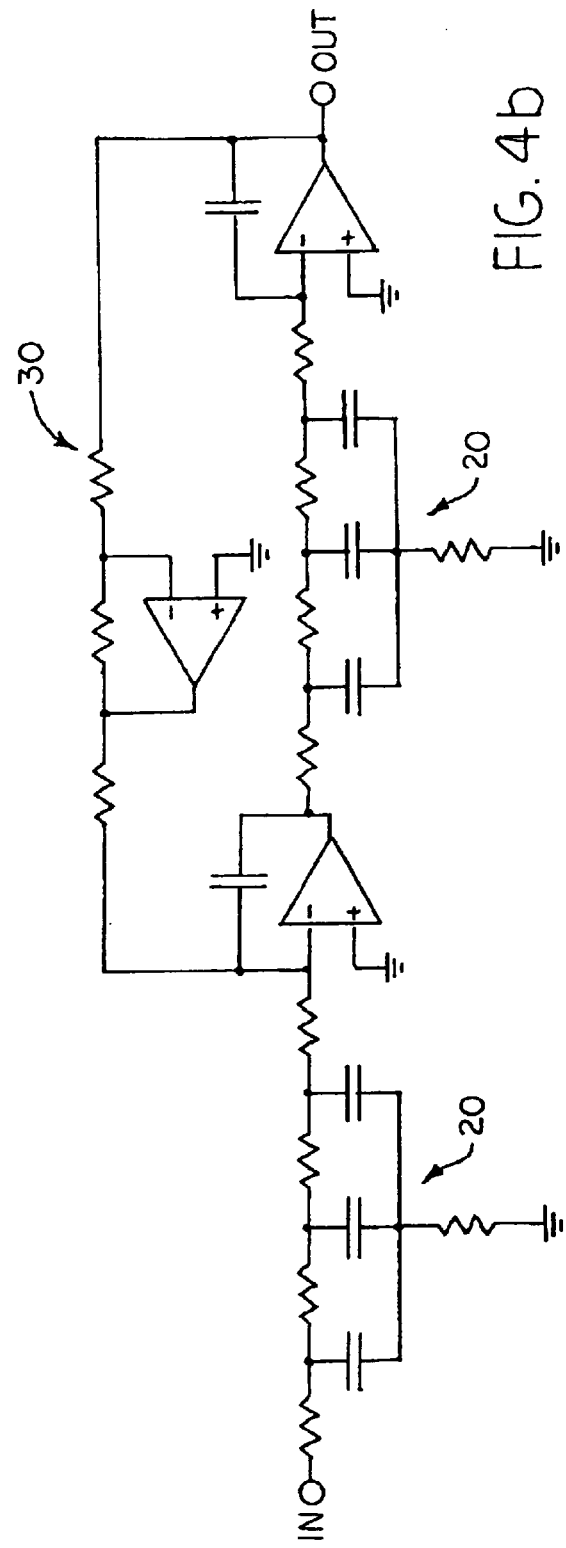

US 6,909,321 B2

ACTIVE ISOLATED-INTEGRATOR LOW-PASS FILTER WITH ATTENUATION POLES

RELATED APPLICATIONS

This application claims the benefit of U.S. Provisional Patent Application Ser. No. 60/174,201, filed Jan. 3, 2000, the complete disclosure of which is hereby expressly incorporated by reference.

BACKGROUND OF THE INVENTION

1. Field of the Invention

The present invention relates to filters, and in particular to low-pass filters with attenuation poles.

2. Description of the Related Art

While most of the literature on passive resistance-capacitance (RC) band-reject, frequency rejecting network (FRN), or notch filters has been dedicated to the bridged full-T filter, another passive RC filter overcomes some of the impracticalities of the bridged full-T filter. That filter is the isolated-integrator band-reject filter, as shown in FIG. 1.

The isolated-integrator band-reject filter has several unique qualities, which the bridged full-T filter lacks. In terms of structure, the isolated-integrator band-reject filter uses capacitors of equal value. This enables the manufacturer to use capacitors of a single production batch, and to grade only one type of capacitor versus many types. Additionally, the capacitors used can be relatively inexpensive NPO ceramic types.

The net capacitance of the filter itself acts to aid the construction of a low-pass filter when incorporated into an active filter design. While attenuation with a voltage source and an open circuit load is symmetrical, the natural design tendency is to include finite impedances for both the voltage source and the load. However, in practice it is more likely that the low-pass pass-band will be gain dominant.

Additionally, the frequency of the isolated-integrator band-reject filter may be tuned in both directions by trimming a single variable resistor. Beyond the advantage of use of a single member, the use of a resistor in particular permits laser trimming or abrasive adjustment methods, which can be applied to mass applied screened-on resistor types in the manufacturing processes. The use of a tuning resistor also enables the reduction of noise during the tuning process as the tuning resistor is connected to ground.

An additional feature of the filter is its ability to provide deep notches even at megahertz frequencies with practical values of components. The notches, or poles, remain deep, even when common component tolerance limits are incorporated. However, infinite notch depth may be attained only with exact and ideal values. Lastly, multiple isolated-integrator band-reject filters can be cascaded if necessary to produce multiple notches as part of the system response.

Additional information regarding resistance-capacitance notch filters is given in the paper "Tunable RC Null Networks," authored by Ralph Glasgal on pages 70–74 of the October 1969 issue of *EEE* which is expressly incorporated herein by reference.

SUMMARY OF THE INVENTION

The present invention involves the inclusion of an isolated-integrator band-reject filter into an active low-pass filter design. The isolated-integrator band-reject filter can be included in many different low-pass filters, such as Sallen & Key, multiple feedback, and state-variable types. The inclusion of the isolated-integrator into active low-pass filter topologies allows some new filters not heretofore known in the literature to be realized.

The present invention provides an active low-pass filter system including an input terminal for receiving a signal from a signal generator, a low-pass filter circuit, an output terminal, and at least one frequency-rejecting network coupled to the low-pass filter circuit. The low-pass filter circuit included in the system has a resistive forward signal flow branch including the frequency rejecting network. In one embodiment, the frequency-rejecting network is an isolated-integrator band-reject filter.

The present invention also provides a power amplifier system for driving a load. The power amplifier system includes an input terminal for receiving a signal from a signal generator, an output terminal connected to the load, a pulse width modulation circuit creating ripple spectra, an error amplifier and modulator connected to an input of the pulse width modulation circuit, a demodulation filter connected to an output of the pulse width modulation circuit, and a feedback control loop coupled to the pulse width modulation circuit and including an active low-pass filter having a feedback demodulation filter and an isolated-integrator frequency-rejecting network. In one embodiment, the isolated-integrator frequency-rejecting network is an isolated-integrator band-reject filter.

BRIEF DESCRIPTION OF THE DRAWINGS

The above mentioned and other features of this invention, and the manner of attaining them, will become more apparent and the invention itself will be better understood by reference to the following description of embodiments of the invention taken in conjunction with the accompanying drawings, wherein:

FIG. 2(a) is a schematic view of second order low-pass Sallen & Key filter including an isolated-integrator band-reject filter in accordance with the present invention.

FIG. 2(b) is a schematic view of a second order low-pass Sallen & Key filter including two isolated-integrator band-reject filters.

FIG. 2(c) is a schematic view of a third order low-pass Sallen & Key filter including two isolated-integrator band-reject filters.

FIG. 3 is a Bode diagram of the amplitude response of the filter of FIG. 2(c).

FIG. 4(a) is a schematic view of a multiple feedback low-pass filter including two imbedded isolated-integrator band-reject filters.

FIG. 4(b) is a schematic view of a state-variable low-pass filter including two isolated-integrator band-reject filters.

DESCRIPTION OF THE PRESENT INVENTION

Figure 1:
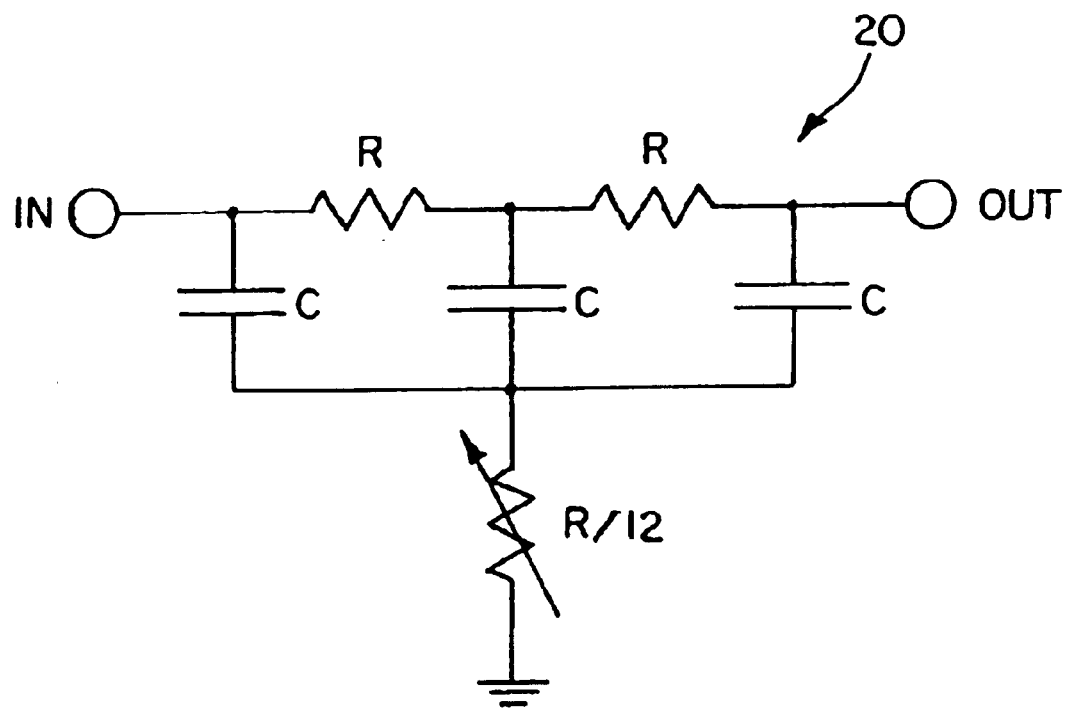
FIG. 1 is a schematic view of an isolated-integrator band-reject filter.

For the purposes of promoting an understanding of the principles of the invention, reference will now be made to the embodiments illustrated in the drawings and specific language will be used to describe the same. It will nevertheless be understood that no limitation of the scope of the invention is thereby intended. The invention includes any alterations and further modifications in the illustrated devices and described methods and further applications of the principles of the invention which would normally occur to one skilled in the art to which the invention relates.

The present invention involves the inclusion of an isolated-integrator band-reject filter 20 (FIG. 1) into an active low-pass filter design. The isolated-integrator band-reject filter can be included in many different low-pass filters, such as Sallen & Key, multiple feedback, and state-variable types, as will be described below.

Referring to FIG. 1, a conventional isolated-integrator band-reject filter 20 is shown. The characteristic equation of the filter shown in FIG. 1 is:

$$G(s) = \frac{(RCs)\wedge 3 + 4(RCs)\wedge 2 + 3RCs + 12}{(RCs)\wedge 3 + 16(RCs)\wedge 2 + 39RCs + 12}$$

and wherein $$f(\text{null}) = \frac{\text{sqrt}(3)}{(2\pi RC)}$$

The isolated-integrator band-reject filter 20 uses capacitors of equal value, designated C, which may be inexpensive NPO ceramic capacitors. In addition to using capacitors of equal value, the resistors R are of a single value. The exception to the general rule of equal value for resistors R is the single tuning resistor R/12, which is connected to ground and provides a means to prevent unwanted noise during the tuning process. As can be seen in FIG. 1, resistor R/12 may be variable; however, the value shown is a value of R/12. In general, the ratio for the value of resistors R of isolated-integrator band-reject filter 20 to resistor R/12 is at worst 12 to 1, which is still well within the range of screened-on processes. Therefore, for simplification, the value presented is R/12.

Referring now to FIG. 2, three embodiments of the present invention are shown in which isolated-integrator band-reject filter 20 is incorporated into the resistive branches of Sallen & Key active low-pass filters. The characteristic null equation of the filters shown in FIGS. 2a, 2b, and 2c is:

$$f(\text{null}) = \frac{\text{sqrt}(3)}{(2\pi R2 \times C2)}$$

or $$= \frac{\text{sqrt}(3)}{(2\pi R6 \times C4)}$$

wherein $$R7 = \frac{R6}{12}$$

and $$R3 = \frac{R2}{12}$$

Additional information regarding the Sallen & Key filter is given in the article "A Practical Method of Designing RC Active Filters," authored by R. P. Sallen and E. L. Key on pages 51–62 of the March 1955 issue of *IRE Transaction Circuit Theory* which is incorporated herein by reference. Although isolated-integrator band-reject filter 20 is placed within a resistive branch of the Sallen & Key filter, additional series resistors are not required in the input or output terminals of the original Sallen & Key filter unless a pole at infinity is desired.

All three embodiments of the present invention shown in FIG. 2 use amplifiers with positive gain, designated as K. The simplest possible implementation of the positive gain is to use a gain of unity, or one, since this eliminates the need for gain setting resistors on a voltage feedback operational amplifier. Gains larger than one, however, may result in simpler capacitor sizing and more stable circuit characteristics.

Turning now to the specific forms found in FIG. 2, FIG. 2(a) depicts the first embodiment of the present invention in which isolated-integrator band-reject filter 20 is incorporated into a Sallen & Key filter resulting in new filter 22. This is a second order system; however, only one finite frequency attenuation pole is produced. In comparison to the basic Sallen & Key filter, one should note that isolated-integrator band-reject filter 20 is used to replace portions of the original resistive branch. One should also note that resistors Rg, R5, and R8 and capacitors C3 and C5 are not part of isolated-integrator band-reject filter 20 and are not necessarily all of equal value.

During operation, one of resistors R5 or R8 could be zero in value; however, if both resistors had zero value, only a single pole at infinity would result. This single pole may be a workable result, although typically not the desired result. Resistor R7 is a variable resistor corresponding to resistor R/12 of FIG. 1, and may have a large range of values, all of which are a fraction of resistors R6.

FIG. 2(b) depicts a second embodiment of the present invention in which isolated-integrator band-reject filter 20 is incorporated into a Sallen & Key filter resulting in filter 24. Like the first embodiment, the second embodiment is a second order system; however, two finite frequency attenuation poles are produced in the embodiment of FIG. 2(b). One should note that two isolated-integrator band-reject filters 20 are incorporated into the basic Sallen & Key filter. As above, R5 or R8 may be zero; however, if both resistors are zero then no second pole would be produced at infinity. The same is true of R4 and Rg. Variable resistor R7 is as described in conjunction with FIG. 2(a). Resistor R3 is also a variable resistor which may have a range of values that are a fraction of the value of resistor R2.

Referring now to FIG. 2(c), filter 26 is depicted in which a third-order low-pass Sallen & Key filter is shown as incorporating isolated-integrator band-reject filters 20. As this is a third order system, it is expected that three poles at infinity will be produced in the response of the system. In order for the three poles to exist at infinity, resistors R1 and R4 cannot be zero simultaneously since Rg is never zero. In practice, one or the other of resistors R1 and R4 may be zero, but not both if three poles are to exist. Otherwise, the structure of the third embodiment is very similar to that of the second embodiment and the same restrictions and distinctions apply.

Although the depicted embodiments only concern second and third order systems, higher order systems are possible with further substitution of isolated-integrator band-reject filter 20 in the resistive branches of higher order Sallen & Key filters. However, one should note that as the order of the low-pass Sallen & Key filter increases, it is less and less critical that all of the possible poles at infinity exist as the cutoff rate may be adequate.

FIG. 3 is the Bode diagram of the amplitude response in decibels (dB) of the third-order low-pass Sallen & Key filter 26 of FIG. 2(c). This diagram depicts the attenuation resulting from the inclusion of isolated-integrator band-reject filters 20 in filter 26. One should note that the numbers used for the Bode diagram do not reflect the only operating parameter for the present invention, but one of many possibilities. The following component values produce the amplitude response depicted in FIG. 3:

K=1
Rg=2.71 KΩ
R1=R4=R8=0 Ω
R2=1.24 KΩ
R3=104 Ω
R5=R6=2.49 KΩ
R7=208 Ω
C1=C2=C3=C4=C5=220 pf

It should be noted that R1 is equal to R4, or both have a value of zero, thus there are only two poles occurring in the system, as stated in the description of the third-order system of FIG. 2(c). The two poles of attenuation 32 and 34 occur at 500 KHz and 1 MHz, respectively. It is also notable that 500 KHz and 1 MHz are the locations where the ripple spectra is expected from a 250 KHz interleave N=2 converter, or the location of harmonics resulting from a 250 KHz converter.

Another item to note is the amount of attenuation produced by the present invention. Specifically, one should note that over 70 dB of attenuation occurs at all frequencies above 450 KHz. Once the frequency reaches 100 KHz, the amplitude response experiences rapid attenuation going from 20 dB at 100 KHz to over 70 dB at 450 KHz. In comparison, the response is only attenuated by 20 dB from 1 KHz to 100 KHz.

Referring now to FIG. 4, both multiple feedback and state variable type filters may be implemented with imbedded isolated-integrator band-reject filters 20 in the feed-forward resistive branches of each filter type. Using isolated-integrator band-reject filters 20 in these types of filters provides additional embodiments of the present invention.

FIG. 4(a) shows a fourth embodiment of the present invention, or filter 28, by depicting a multiple-feedback filter having a pair of isolated-integrator band-reject filters 20 creating two poles, or notches, for the system. Depending on the order of the multiple-feedback filter, this embodiment of the present invention can be inverting at DC, thus altering its potential uses. However, the addition of an inverter should correct any problems with inversion according to principles well known in the art.

In FIG. 4(b), a fifth embodiment of the present invention is shown in which a state-variable filter includes isolated-integrator band-reject filters 20 resulting in filter 30. State-variable filters can be readily configured with three feed-forward resistive branches, each of which would support a frequency-rejecting network. However, the embodiment of the present invention disclosed shows the more common state-variable filter as including two feed-forward resistive branches with an isolated-integrator band-reject filter 20 in each branch as shown in FIG. 4(b). Resultant filter 30 creates a double notch as did the multiple feedback type filter. Again, like the multiple feedback type filters, the inversion issue can affect the uses of this filter; but the inclusion of an inverter should correct the inversion problem.

If a frequency rejecting network, such as an isolated-integrator band-reject filter, is placed in the feedback path around a high-gain amplifier, the result is a band-pass or frequency-emphasizing network (FEN). Such derivations are considered within the scope of this invention.

Figure 5:
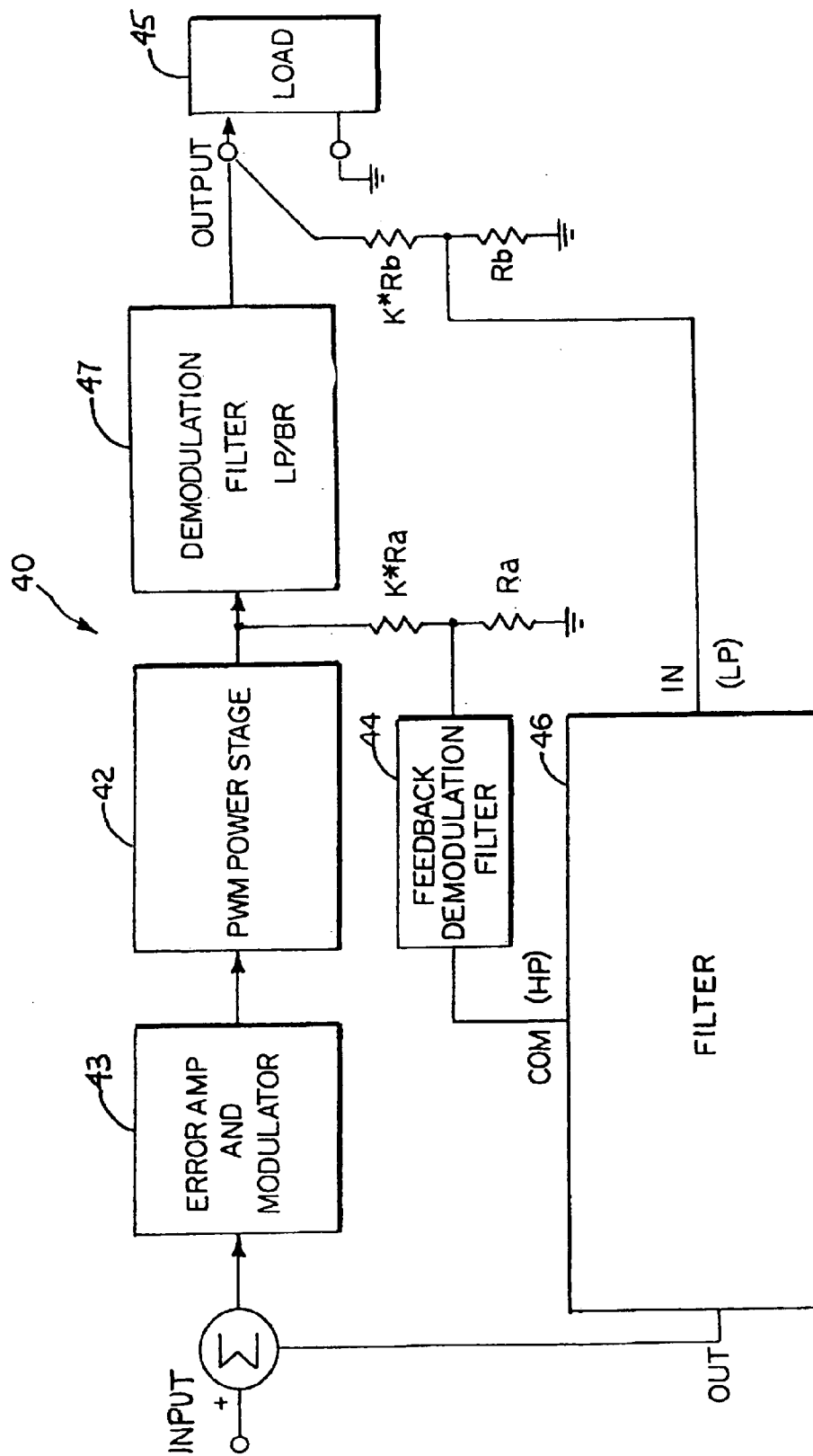
FIG. 5 is a schematic view of a pulse width modulated amplifier with a feedback filter in which the present invention could be utilized.

Referring now to FIG. 5, a block diagram depicts another embodiment of the present invention in which isolated-integrator band-reject filter 20 is included as part of feedback demodulation filter 44. This embodiment addresses the issue of removing pulse width modulated (PWM) spectra from the feedback signals of a fixed-frequency switch-mode amplifier. In the removal of the PWM spectra from the feedback signals, a high-performance amplifier may need two attenuation poles, or notches. In FIG. 5, power amplifier 40 includes PWM power stage 42 driven by an error amp and modulator stage 43 producing PWM ripple spectra, and feedback demodulation filter 44 to remove the PWM ripple spectra from the feedback signal prior to entry into filter 46. Feedback demodulation filter 44 includes at least one isolated-integrator band-reject filter 20. An output demodulation filter 47 is connected to the load 45.

DESCRIPTION OF THE PRESENT INVENTION

Figure 6:
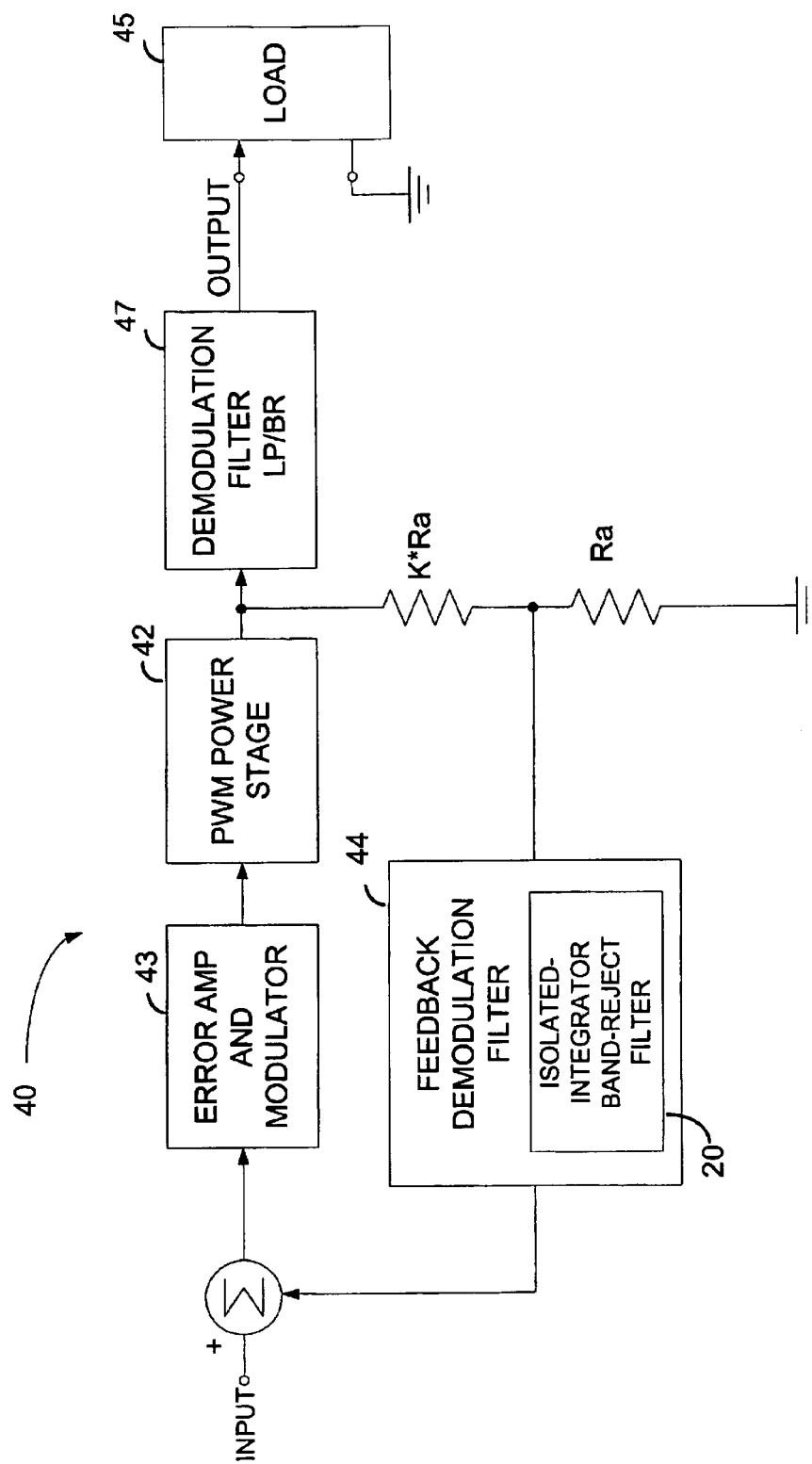
FIG. 6 is a schematic view of another pulse width modulation amplifier with a feedback filter in which the present invention could be utilized.

As illustrated in FIG. 6, the present invention also provides a power amplifier system 40 for driving a load 45. The power amplifier system 40 includes an input terminal for receiving a signal from a signal generator, an output terminal connected to the load 45, a pulse width modulation circuit 42 creating ripple spectra, an error amplifier and modulator 43 connected to an input of the pulse width modulation circuit 42, a demodulation filter 47 connected to an output of the pulse width modulation circuit 42, and a feedback control loop coupled to the pulse width modulation circuit 42 and including an active low-pass filter having a feedback demodulation filter 44 and an isolated integrator frequency-rejecting network. In one embodiment, the isolated-integrator frequency-rejecting network is an isolated-integrator band-reject filter.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. An active low-pass filter system including:
   a low-pass filter circuit that includes a resistive forward signal flow branch and a Sallen & Key filter; and
   an isolated-integrator band-reject filter coupled to the resistive forward signal flow branch.

2. The active low-pass filter system of claim 1, wherein the low-pass filter circuit includes a first resistor and a second resistor, the isolated-integrator band-reject filter electrically connected between the first and second resistors.

3. The active low-pass filter system of claim 2, wherein at least one of the first and second resistors has a resistive value of zero.

4. The active low-pass filter system of claim 1, wherein the isolated-integrator band-reject filter includes at least three capacitors with equal value and at least two resistors with equal value.

5. The system of claim 1, wherein the band-reject filter includes a resistor for tuning the band-reject filter.

6. A power amplifier system for driving a load comprising:
   a pulse width modulation power circuit creating ripple spectra;
   an error amplifier and modulator circuit connected to an input of the pulse width modulation power circuit;
   a demodulation filter connected between said pulse width modulation power circuit and the load;
   a feedback control loop coupled to said error amplifier and modulator circuit and including;

an active low-pass filter;
a first resistive voltage divider circuit coupled between the output of said demodulation filter and a first input of said low-pass filter;
a feedback demodulation filter coupled to a second input of said low-pass filter and including at least one isolated-integrator band-reject filter; and
a second resistive voltage divider circuit coupled between the output of said pulse width modulation power circuit and said feedback demodulation filter.

7. A power amplifier system for driving a load comprising:
a pulse width modulation power circuit having an input and an output;
an error amplifier and modulator circuit connected to the input of the pulse width modulation power circuit;
a demodulation filter connected to the output of the pulse width modulation power circuit;
a feedback control loop coupled to the error amplifier and modulator circuit and to the output of the pulse width modulation power circuit, the feedback control loop including a feedback demodulation filter, wherein an isolated-integrator band-reject filter is imbedded within the feedback demodulation filter.

8. The system of claim 7, wherein the isolated-integrator band-reject filter includes a variable resistor for turning the isolated-integrator band-reject filter.

9. The system of claim 7, wherein the feedback demodulation filter is operable as a low-pass filter to remove pulse width modulated spectra from the feedback control loop, the pulse width modulated spectra produced by the pulse width modulation power circuit.

10. The system of claim 7, wherein the feedback demodulation filter includes a resistive forward signal flow branch, the isolated-integrator band-reject filter being electrically connected within the resistive forward signal flow branch.

11. An active low-pass filter system comprising:
a low pass filter circuit having an input terminal and an output terminal, wherein the low-pass filter circuit includes a Sallen & Key filter; and
an isolated-integrator band-reject filter incorporated into the low pass filter circuit between the input terminal and the output terminal.

12. The active low-pass filter system of claim 11, wherein the low-pass filter circuit includes a resistive forward signal flow branch between the input terminal and the output terminal, the isolated-integrator band-reject filter is incorporated into the resistive forward signal flow branch.

* * * * *